(12) United States Patent
D'Amico et al.

(10) Patent No.: US 8,457,826 B2
(45) Date of Patent: Jun. 4, 2013

(54) SUPPORT FOR ELECTRONIC EQUIPMENT

(75) Inventors: Alessio M. D'Amico, Rome (IT); Fabrizio Loppini, Rome (IT); Stefano Mezzini, Rome (IT)

(73) Assignee: International Business Machines Corporation, Armonk, NY (US)

( * ) Notice: Subject to any disclaimer, the term of this patent is extended or adjusted under 35 U.S.C. 154(b) by 353 days.

(21) Appl. No.: 12/906,098

(22) Filed: Oct. 17, 2010

(65) Prior Publication Data

US 2011/0090663 A1    Apr. 21, 2011

(30) Foreign Application Priority Data

Oct. 21, 2009  (EP) ..................................... 09173674

(51) Int. Cl.
*H02J 1/00*      (2006.01)
(52) U.S. Cl.
USPC ............................................ 701/23; 429/428
(58) Field of Classification Search
USPC .................. 701/1, 23, 24, 36; 714/E11.14; 429/428–432, 433; 361/62–66, 809
See application file for complete search history.

(56) References Cited

U.S. PATENT DOCUMENTS

| 7,114,555 | B2 | 10/2006 | Patel et al. |
| 7,461,849 | B2 | 12/2008 | Robbins et al. |
| 7,465,505 | B2 * | 12/2008 | Shioya ........................... 429/443 |
| 8,288,028 | B2 * | 10/2012 | Batra .............................. 429/99 |

FOREIGN PATENT DOCUMENTS

| JP | 10265012 A | 10/1998 |
| JP | 2003088429 A | 3/2003 |
| WO | 2005084488 A1 | 9/2005 |

\* cited by examiner

*Primary Examiner* — Dalena Tran
(74) *Attorney, Agent, or Firm* — Marcia L. Doubet

(57) ABSTRACT

A mobile support such as a rack or a platform for a rack housing a server or other electronic equipment is capable of independent movement and automatic connection and disconnection from resources such as network connection, coolant supply and power supply. The coordination of a plurality of such mobile supports is envisaged so as to automatically distribute equipment in a data center in such a way as to optimally use space and resources.

13 Claims, 7 Drawing Sheets

SUPPORT FOR ELECTRONIC EQUIPMENT

CROSS REFERENCE TO RELATED APPLICATION

This application claims priority of European Patent Application 09173674.4 titled "Method and System for support of electronic equipment", filed on Oct. 21, 2009.

BACKGROUND

The present invention relates to a mobile support for electronic equipment and managing such mobile support. More particularly, embodiments of the invention relate to the automated repositioning of servers or other large electronic systems in a data centre or similar environments.

A data centre comprises infrastructure catering to the various requirements of the electronic systems it houses, including cooling, power supply, network resources, fire control, etc. The resources available to satisfy these requirements are necessarily finite, and the infrastructure generally imposes further constraints on the resources that can conveniently be made available at any physical point in the data centre environment. For example, excessive demands on any one resource in a particular location may well mean that the full requirements of all systems at that location cannot be met, thereby limiting the performance of some or all of these systems, even if satisfactory resources may have been available at an alternative location.

One response to this problem is to build a substantial redundancy into the system so as to handle such localized peaks in demand. This however can considerably increase the expense and complexity of the centre, for infrastructure that is only occasionally used. Other partial solutions may include analysis of air flow or intelligent control of air conditioning so as to obtain the maximum benefit from available cooling, smarter hardware with lower energy consumption, smarter software to optimize usage of resources, and so on. For example, U.S. Pat. No. 7,214,131 describes an airflow distribution control system for use in a raised floor data centre, which has sensors coupled to under floor partition, to detect parameters indicative of airflow distribution, and accordingly controls flow resistance of partition. Furthermore, it is known from US Patent Publication 20080004837A1 to generate a dynamic power flux map for computer systems in data centres, involving correlating locations of computer systems, determined using preset tags on systems, with dynamic traces of power consumption of computer systems.

Nevertheless, none of the above approaches has been found to be entirely satisfactory.

FIG. 1 shows a conventional data centre environment. As shown, there is provided a plurality of computers 140, 150, 160, each of which may contain a network interface 161, a processor 162, and one or more environment sensors, such as temperature sensors 163. Each computer 140, 150, 160 is connected to a power connection such as the connection 132, and a network connection 135. As shown in FIG. 1, the power consumption through the power connection is monitored by the power monitoring module 131, which is also connected to the network connection 135 through which power consumption information may be reported to a processor 112. The processor 112 is also connected to one or more environment sensors 111, such as temperature sensors. The processor may thus receive information concerning the values of the environment sensors 163 and 111, from the power monitoring module 131, and from the network connection 135 itself. On the basis of the received information, the processor may attempt to adjust workloads of the respective computers or the distribution of cool air as a function of detected conditions as described in the cited prior art.

BRIEF SUMMARY

According to the present invention, there is provided a system comprising a mobile support for electronic equipment, a method of managing support for electronic equipment, and a computer program embodied on computer readable medium for providing mobile support for electronic equipment. In one aspect, this comprises: receiving, at said mobile support for said electronic equipment, a predetermined signal; operating a releasable coupler to disengage a power supply system of said mobile support from a first external power source at a first location, responsive to receiving said predetermined signal; causing displacement of said mobile support from said first location to a second location by instructing a powered displacer integrated in said mobile support and operating under power supplied by a UPS unit integrated in said mobile support; and operating the releasable coupler to releasably couple said power supply system to a second external power source at said second location.

BRIEF DESCRIPTION OF THE SEVERAL VIEWS OF THE DRAWINGS

Embodiments of the present invention will now be described by way of example with reference to the accompanying drawings in which like references denote similar elements, and in which.

DETAILED DESCRIPTION

It has been observed that the climate condition inside a data centre changes drastically during the same day, in response to the outside changing weather conditions. Because the computers' cabinets are static, the only measure to fight those changes in order to maintain the efficiency is mainly to increase or decrease the cooling power.

Figure 1:
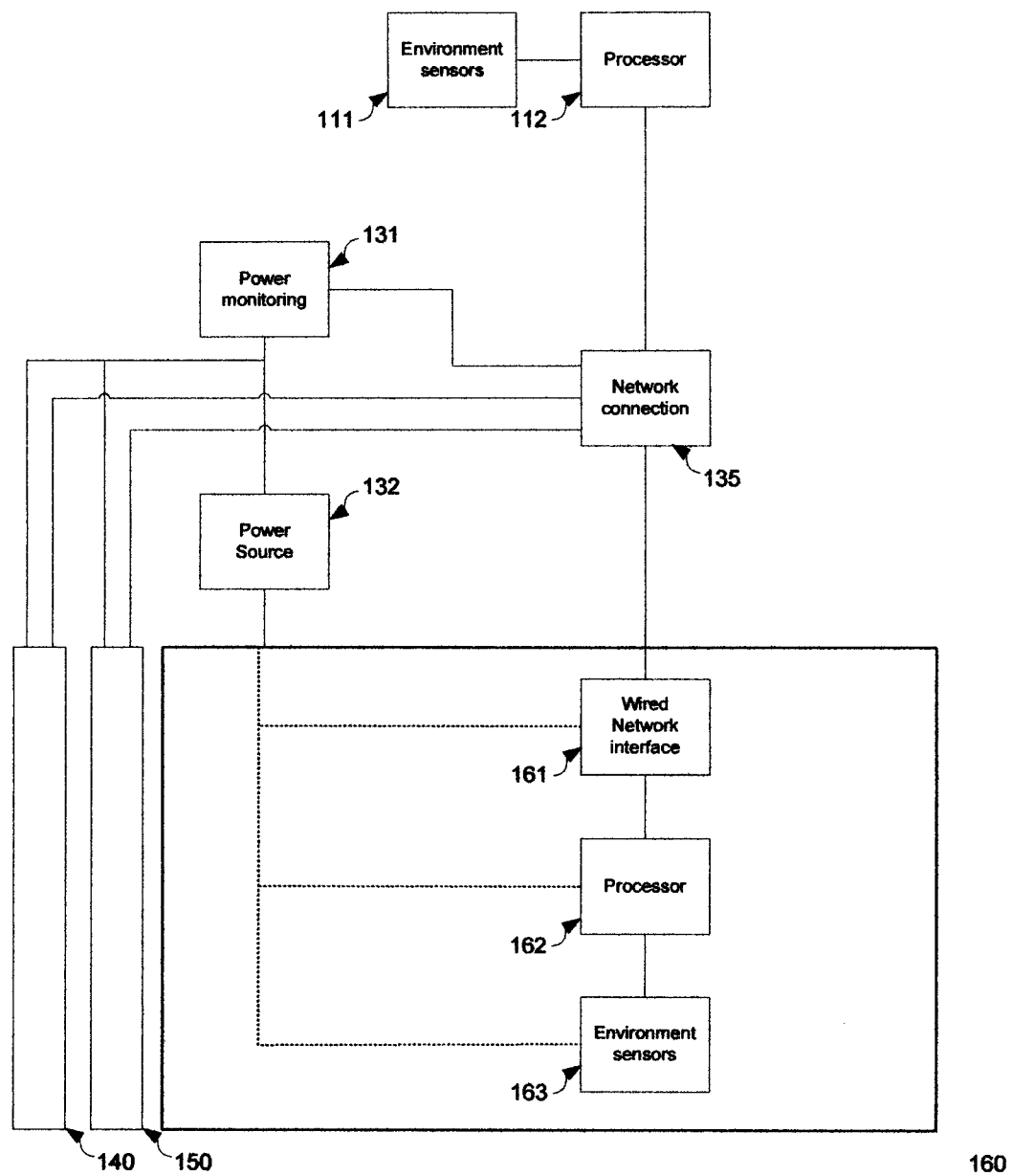
FIG. 1 shows a conventional data centre environment.
Figure 2:
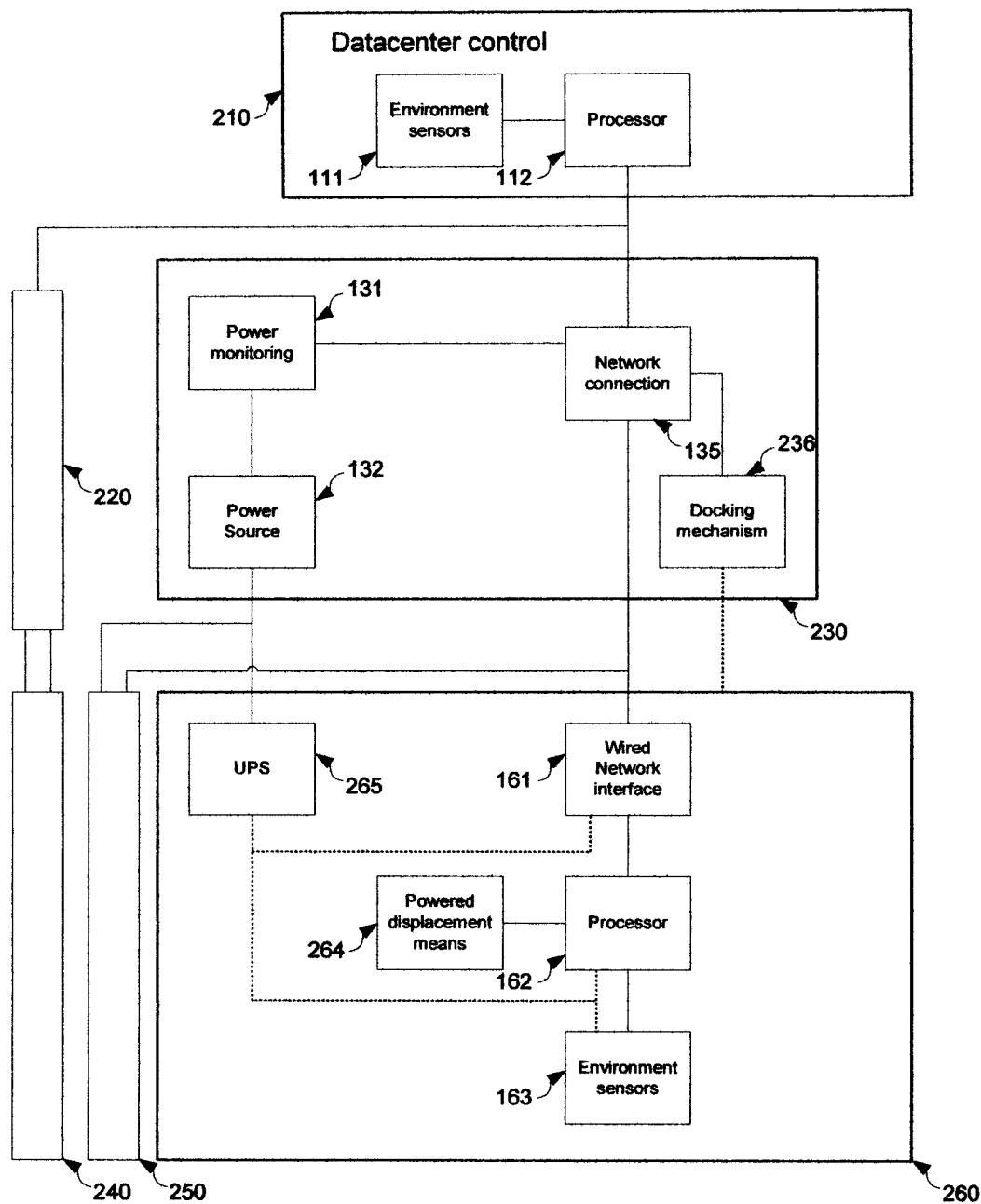
FIG. 2 shows a first embodiment of the invention.

FIG. 2 shows a first embodiment of the invention. As shown in FIG. 2, there is provided a data centre control unit 210, socket units 220, 230, and mobile supports 240, 250, 260. The mobile support 260 comprises a wired network interface 161, a processor 162, and environment sensors 163, substantially as described with regard to FIG. 1. Additionally, the mobile support 260 comprises a subsystem which in the present example is a power supply system comprising an unbreakable power supply (UPS) unit 265 means for releasably coupling said power supply system to a resource required by that subsystem, which in the present example is the external power source 132. The mobile support further comprises powered displacement means 264 (referred to equivalently herein as "a powered displacer"). In accordance with the present invention, in response to a predetermined signal, said mobile support is adapted to disengage from the external power source 132, to displace itself to a second location using the powered displacer 264 operating under power supplied by said UPS unit 265, and to releasably couple said power supply system to said second external power source. Preferably, each socket unit 220, 230 comprises a docking mechanism 236 which is adapted to releasably couple said mobile support 260, for example at the same time as the releasable coupling of the power supply system to the external power source. As shown in FIG. 2, one or more further mobile supports 240, 250 may be connected to the socket unit 230, or to a further socket unit 220. Thus by means of the foregoing elements, there is provided a mobile support which is adapted to autonomously displace itself from one socket unit to another in response to a predetermined signal, and to connect itself to one or more resources provided at that socket unit to supply the needs of the electronic equipment mounted on the mobile support.

Figure 3:
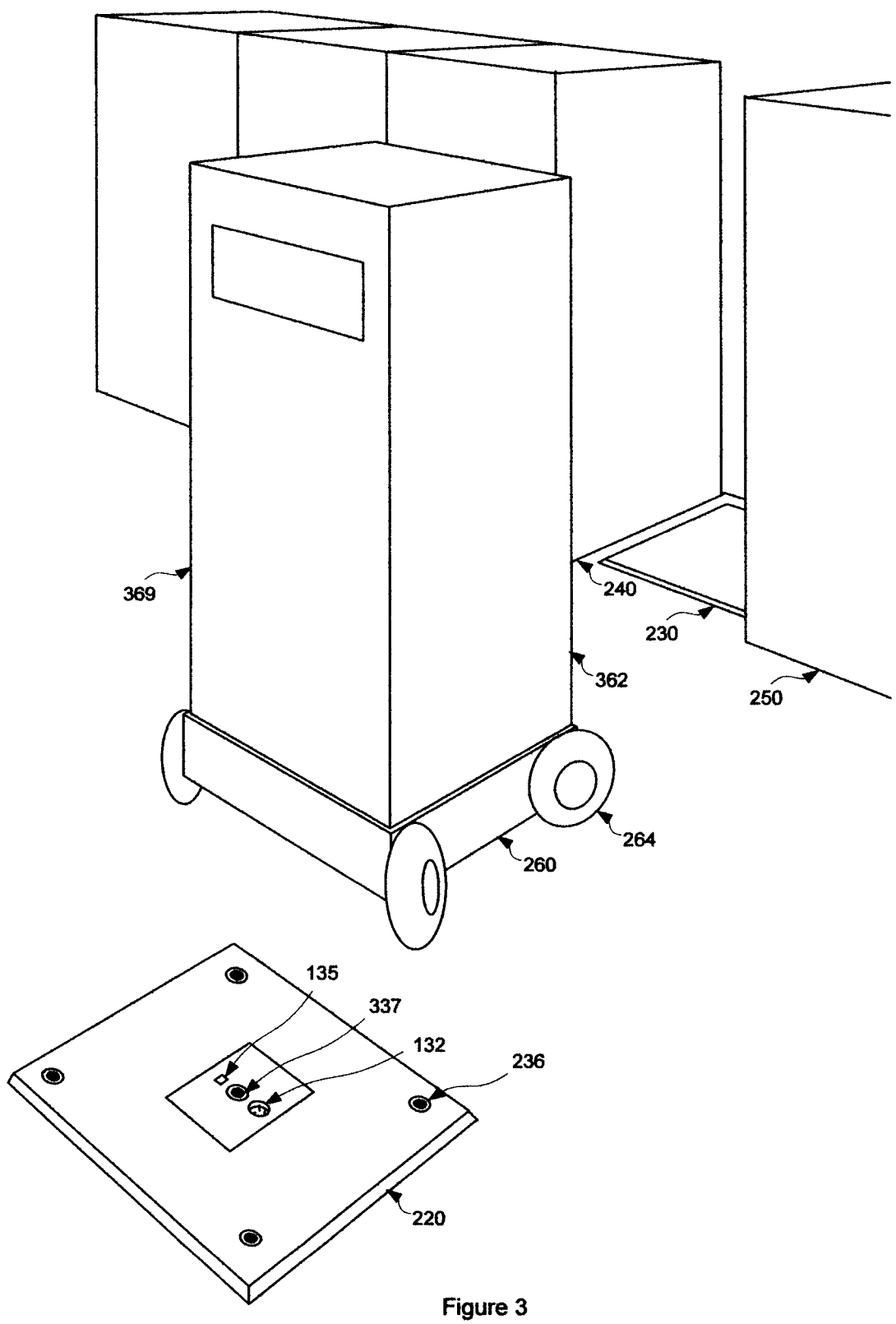
FIG. 3 shows an example of the invention in operation.

FIG. 3 shows an example of the invention in operation. As shown therein, the mobile unit 260 is in the process of displacing itself from a first location between further mobile support units 240 and 250 at which a first socket unit 230 is situated, to a second location at which a second socket unit 220 is situated. The second socket unit 220 as shown comprises a wired network connection 135, which may for example be an Ethernet connection by means of a standard RJ45 connector or any other network technology and connection interface as may be expedient. In particular, a low insertion force design connector may be particularly appropriate. The second socket unit 220 as shown further comprises a power source connection 132, which may, for example, be a conventional single or three phase mains supply by means of a standard three pin plug and socket connection or any other AC or DC power supply and connection interface as may be expedient. In particular, a low insertion force design connector may be particularly appropriate. The second socket unit 220 as shown further comprises a coolant connection 337, which may, for example, be a conduit providing a coolant fluid such as a gas or liquid, including air or water. The connection may be by means of any appropriately sealing connector, and a low insertion force design connector may be particularly appropriate. The three connectors described above are examples of resources which may be exploited by subsystems of the mobile support 260. Other examples are SCSI, Fiber Channel, eSATA, or iSCSI connections.

The second socket unit 220 as shown further comprises a docking mechanism 236, which may be any suitable mechanism for releasably locking the second socket 220 and the mobile support 260 together in a substantially fixed geometric relationship one to the other, so that the mobile support cannot be displaced away from the second socket inadvertently or by accident. Such a mechanism might involve pins or bars descending vertically from the mobile support into receiving apertures at the four corners of the second socket 220 as shown, or hooks, latches, threaded elements, or any other mechanism as will occur to the skilled person. In any case, the mechanism is preferably controlled electronically so as to be entirely automatic and integrated with the system as a whole. As described above, the mobile unit 260 comprises a powered displacer, which as shown in FIG. 3 comprises a set of four wheels, at the four corners of the mobile unit. The displacer is preferably actuated by means of one or more electric motors. As shown, at least two of the wheels are dirigible. The wheels may be intended to run on rails integrated in the data centre, which may be on the floor, overhead, or anywhere in between. There may be any appropriate number of wheels or caterpillar tracks. The powered displacement means might alternatively be a robot arm or other fixed mechanism. As shown, the electronic equipment 369 mounted on the mobile support is a large computer unit such as a mainframe computer or a rack containing various pieces of electronic equipment, possibly including blade type computer units and the like. The electronic equipment 369 may be partially or fully integrated with the functions of the mobile support. For example, the processor 162 may be a processor of a computer unit belonging to the electronic equipment, as may the network interface 161 or some or all of the environment sensors 163, for example in a case where the processor 162 itself comprises temperature sensors and the like. Similarly, the UPS 265 may be part of the larger power management subsystem of the electronic equipment 369 as a whole. Alternatively, the mobile support 260 may be entirely autonomous with its own processor 162, network interface 161, UPS 265, etc. In a case where the mobile support is partially or entirely autonomous with respect to the electronic equipment mounted thereon, it is nevertheless preferably adapted to pass through resources required by the electronic equipment, i.e., power, cooling, network resources, etc., as required.

It may be appreciated from the foregoing that the mobile support 260 may be considered to have two modes of operation.

Figure 4A:
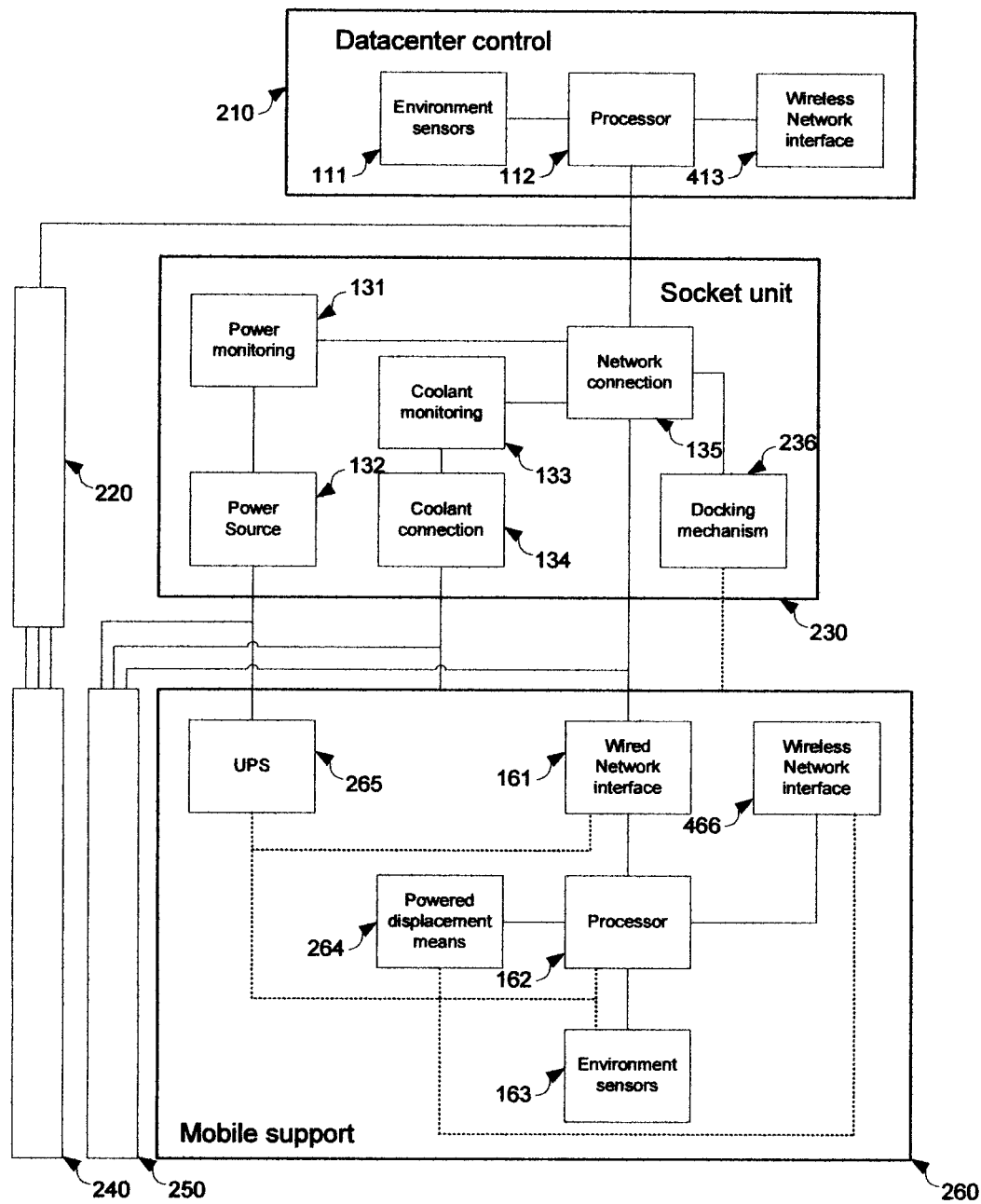
FIG. 4a shows the system with the mobile support 260 in a first configuration.

FIG. 4a shows the system with the mobile support 260 in a first configuration. In this first configuration, the UPS 265 and wired network interface 161 are coupled respectively to the power source connection 132 and network connection 135 of the socket unit 230, so that the process of the mobile support and preferably the electronic equipment mounted thereon are able to use the resources of the data centre infrastructure. Similarly, the mobile support 260 is coupled to the coolant connection 134 of the socket unit 230. As shown, the coolant connection 134 is provided with a coolant monitoring module 133, which reports status to the data centre control processor 112 via the network connection 135. Thus in this configuration, all of the needs of the mobile support and preferably the equipment mounted thereon are provided by the "umbilical" connection through the socket unit 230. Furthermore, as shown in FIG. 4a, the docking mechanism 236 of the socket unit 230 is coupled to the mobile support 260, thereby fixing it in place. Still further, it will be noted that in accordance with this embodiment, the mobile support 260 is provided with a wireless network interface 466 which is in communication with the processor 162. The data centre control module 210 is correspondingly provided with a wireless network interface 413, which is in communication with the data centre control processor 112. The wireless interfaces 413 and 466 may be adapted for WIFI, Bluetooth, or any other wireless communication method as may be appropriate.

As described above, the mobile support 260 is adapted in response to a predetermined signal to disengage from the external power source 132, and any other resources to which it is connected via the socket unit 230, and where appropriate to disengage the docking mechanism, whereupon the system enters a second configuration.

This predetermined signal is preferably emitted by the data centre control processor 112, for example via the network connection 135.

Figure 4B:
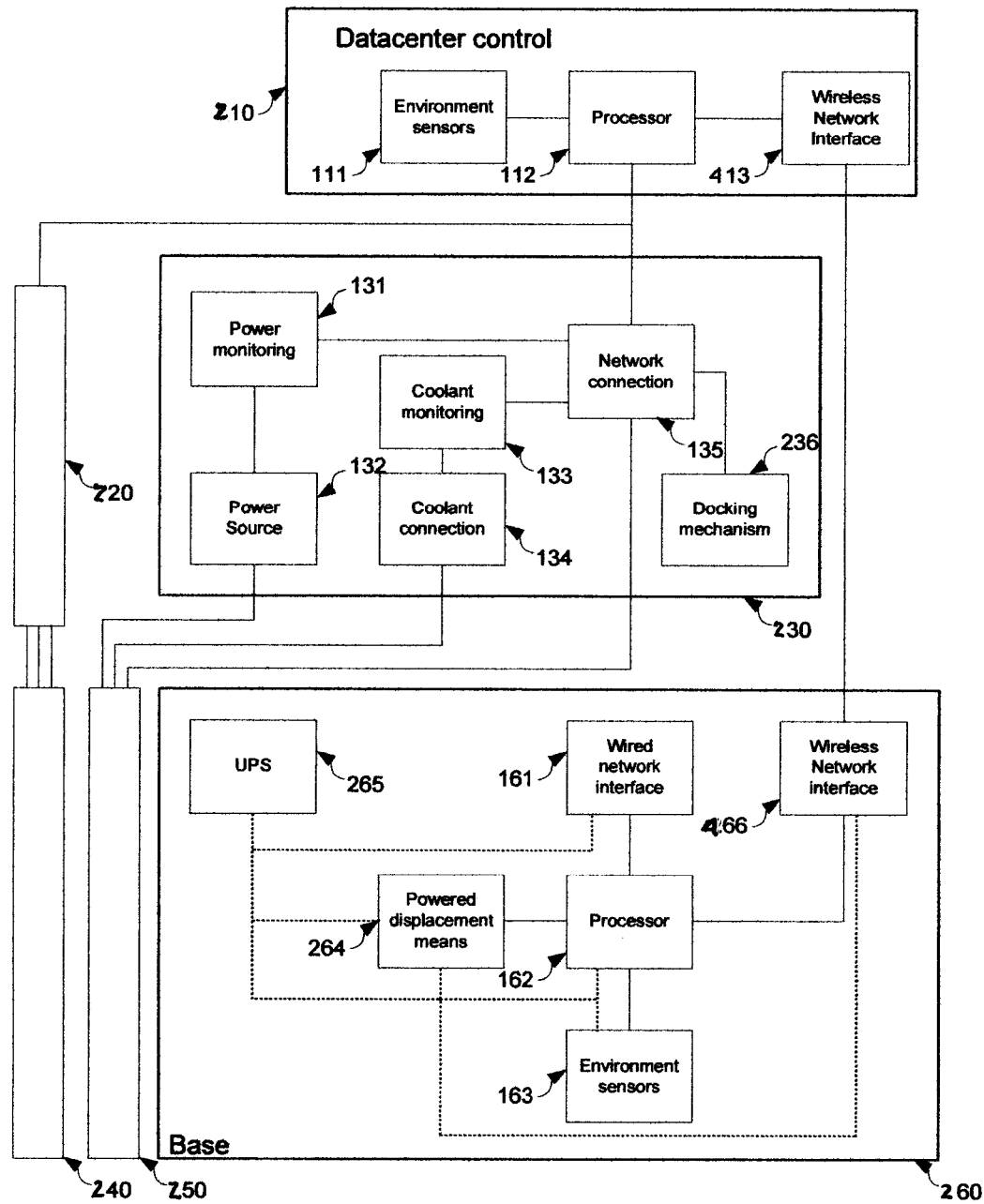
FIG. 4b shows the system with the mobile support 260 in a second configuration.

FIG. 4b shows the system with the mobile support 260 in a second configuration. According to this second configuration, neither the UPS 265 or the wired network interface 161 are coupled to the power source connection 132 or the network connection 135 of the socket unit 230. Similarly, the mobile support 260 is disconnected from the coolant connection 134 and the docking mechanism 236 of the socket unit 230. Thus, the mobile support becomes dependent on the capacity of the UPS 265 for its power requirements. Any equipment mounted on the mobile support may be shut down or in a low power consumption mode of operation, or may alternatively also draw on the capacity of the UPS. The mobile support and any equipment mounted thereon will become dependent on cooling from the surrounding atmosphere, and may optionally incorporate an auxiliary cooling system power from the UPS. As shown, in the absence of a wired network connection, the wireless network interface 466 of the mobile support 260 optionally enters into communication with the data centre control wireless network interface 413.

Whilst in this second configuration, the mobile support 260 displaces itself to a second location by means of said powered displacement means operating under power supplied by UPS unit 265. The displacement may involve a pause of any length, for example in a storage location, a maintenance location, a technical location at which the equipment mounted on the mobile support is changed or configured, etc. The second location may, in fact, be the same as the first location, in which case the mobile support simply moves away from the first location before returning. The second location may provide only a subset of the resources required by the mobile support or the electronic equipment mounted on it. For example, the second location may be a parking location with a power connection to maintain essential services but without the cooling, network, or other resources necessary for the mobile support or the equipment mounted on it to be fully functional.

According to certain embodiments, the predetermined signal simply specifies the second location, for example relative to a grid defined for the data centre environment or as a direction and distance from the mobile support's present position. In a case where the mobile support 260 is in wireless communication with the data centre control module 210, the predetermined signal may be transferred piece wise, with a flow back and forth between the mobile support and the data centre control module as the mobile support provides updates concerning its present position, difficulties encountered, the level of reserve power available from the UPS 265, and so on. Meanwhile, the data centre control module 210 may provide a stream of instructions with updated coordinates or motion instructions. The distribution of intelligence between the data centre control module and the mobile support may be handled at any point on a continuous scale between a situation where the mobile support is entirely autonomous and the predetermined signal is generated internally on one hand, to a situation where the mobile support includes only the most basic control interface to the powered displacement means and all calculations concerning the actions to be taken by the mobile support are carried out at the control centre.

The predetermined signal is predetermined in the sense that it is preferably constructed according to a defined format and instruction set, so that there is a finite set of possible instructions.

The predetermined signal may be generated in response to values generated by the environment sensors 163 or 111, which may, for example, indicate that the temperature in a particular part of the data centre, the mobile support, or a piece of equipment mounted on the mobile support has crossed a particular threshold, in which case the predetermined signal will be calculated to displace the mobile support to a position where, for example, the ambient temperature is lower, for example, due to lesser demands on the cooling system in that area, or due to time dependent changes in incident solar energy, etc. These calculations may conveniently be handled in a central manner by the data centre control module which receives environment information from an array of sensors distributed through the data centre as well as integrated in the various pieces of hardware housed therein.

The predetermined signal may be generated in response to values generated by the power monitoring module 131, the coolant monitoring module 133, or the network connection 135, which may, for example, indicate that the resource to which they relate respectively (i.e., power supply, coolant capacity, or network resources) is under excessive demand in a particular part of the data centre, the mobile support, or a piece of equipment mounted on the mobile support, in which case the predetermined signal will be calculated to displace the mobile support to a position where, for example, the density of network connections, or the power or coolant consumption, is lower. These calculations may conveniently be handled in a central manner by the data centre control module which receives environment information from an array of sensors distributed through the data centre as well as integrated in the various pieces of hardware housed therein.

Of course, in either of the proceeding examples, rather than responding to a particular threshold, the system may act continually to maintain close to an even distribution of demand for the various resources under consideration. Such an approach may call for a weighting to be attributed to different resources so that the system can appropriately make trade-offs between the different resources. Similarly, to avoid a state of continuous movement in response to minor changes in conditions, it would be desirable to incorporate a hysteresis or inertia whereby it is necessary for the sum of changes to exceed a threshold before a rearrangement of mobile stations is envisaged.

It will be appreciated that in a data centre containing a plurality of mobile supports in accordance with the present invention, the movement of one mobile support will necessarily have a knock-on effect on the operating conditions of the other mobile supports. Again, this could lead to an unstable situation where the movement of each mobile support provokes a reaction from others, so that the whole data centre is in continuous movement. Accordingly, it would be desirable for the distribution of all mobile supports to be calculated centrally, or negotiated between mobile supports, so that given a particular distribution of conditions, an optimal distribution of mobile supports can be determined, to which no further movements are required until a new change in overall conditions is detected.

In a situation where it is determined that more than one mobile support must be moved in order to arrive at a satisfactory distribution of resource supply and demand throughout the data centre, the system may calculate a predetermined signal to be transmitted to each respective mobile support in such a way as to take into account the simultaneous movements of the other mobile supports at the same time. More particularly, the movement instructions may be calculated so as to bring about an optimally choreographed movement of mobile supports, such that no mobile support obstructs any other, that the total expenditure of energy in movement and the aggregate offline time of the moved mobile supports is minimised. Due weighting may be given to mobile supports on which are mounted equipment performing particularly important function. Again, the choreography may be calculated centrally, or negotiated between mobile supports.

It will be appreciated that the functions ascribed to the data centre control or any centralised processing may be implemented in a mobile support, or equipment mounted on a mobile support, in which case the data centre as a whole may be considered as being potentially nomadic.

It will be appreciated that the functions ascribed to the data centre control or any centralised processing may be distributed across any number of mobile supports, in a grid or distributed computing manner. By this means, the intelligent behaviour of the data centre as a whole acquires a robust character whereby the failure of one component of the data centre does not threaten the intelligent behaviour of the data centre as a whole.

FIGS. 5a to 5d demonstrate certain behaviours that may arise in a data centre comprising a number of mobile supports in accordance with the present invention.

Figure 5A:
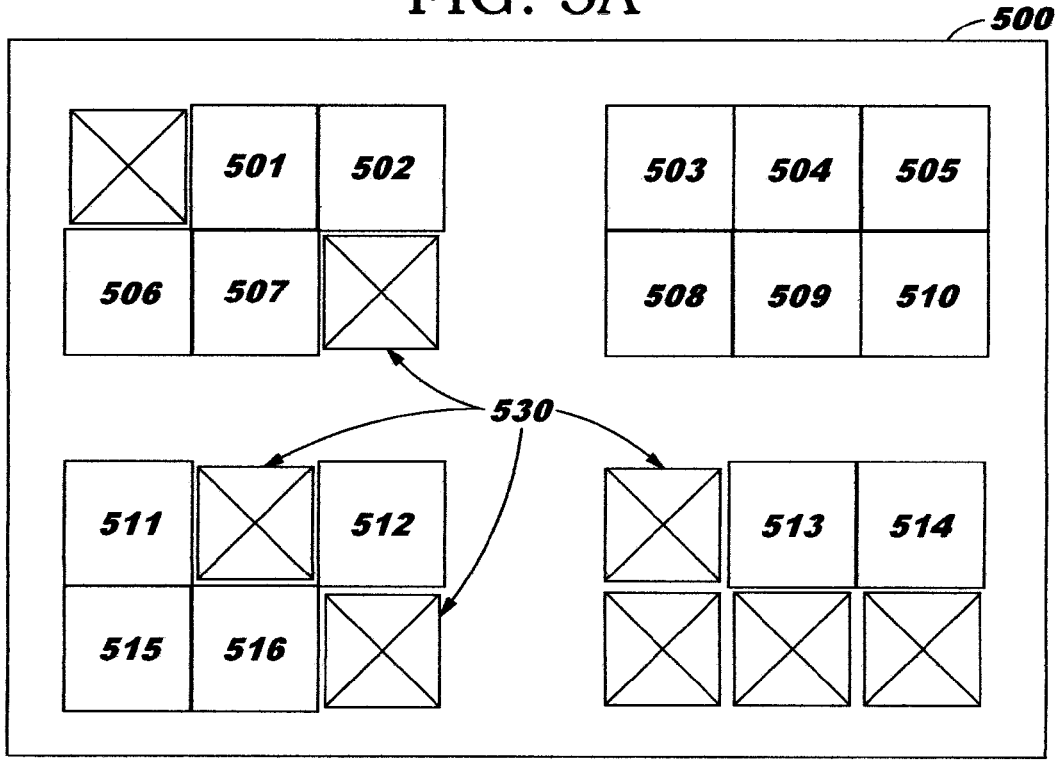
FIGS. 5a to 5d demonstrate certain behaviours that may arise in a data centre comprising a number of mobile supports in accordance with the present invention.

FIG. 5a shows a first distribution of mobile supports in accordance with the present invention. As shown, there is provided a data centre 500 containing 16 servers 501 to 516, each server being mounted on a mobile support substantially as shown in FIG. 3. The data centre is provided with 24 socket units 530, which are fixed to the floor of the data centre in four blocks of six, the four blocks being arranged in a two by two matrix of blocks, each block of six being arranged in a two by three matrix of socket units. For the sake of the present example, it will be assumed that the capacity of each socket unit, each block of socket units, and the infrastructure supporting the socket units is equal. As shown, the servers are distributed unevenly and somewhat randomly amongst the available socket units. This distribution may be considered to represent a random distribution as may arise in a conventional data centre where consecutive installations and disinstallations lead to a disordered and unoptimised distribution of hardware. Alternatively, such an arrangement may arise through the optimisation of a complex and contradictory set of requirements and demand.

In either case, for the purpose of the present example, it will now be assumed that the activities of the different servers become equal, as do the respective resource requirements, for example in terms of power supply, network connections, coolant, etc. On this basis, the system will calculate an optimised distribution and transmit instructions to each server that is required to move, calculated to bring about the desired movement as discussed above.

Figure 5B:
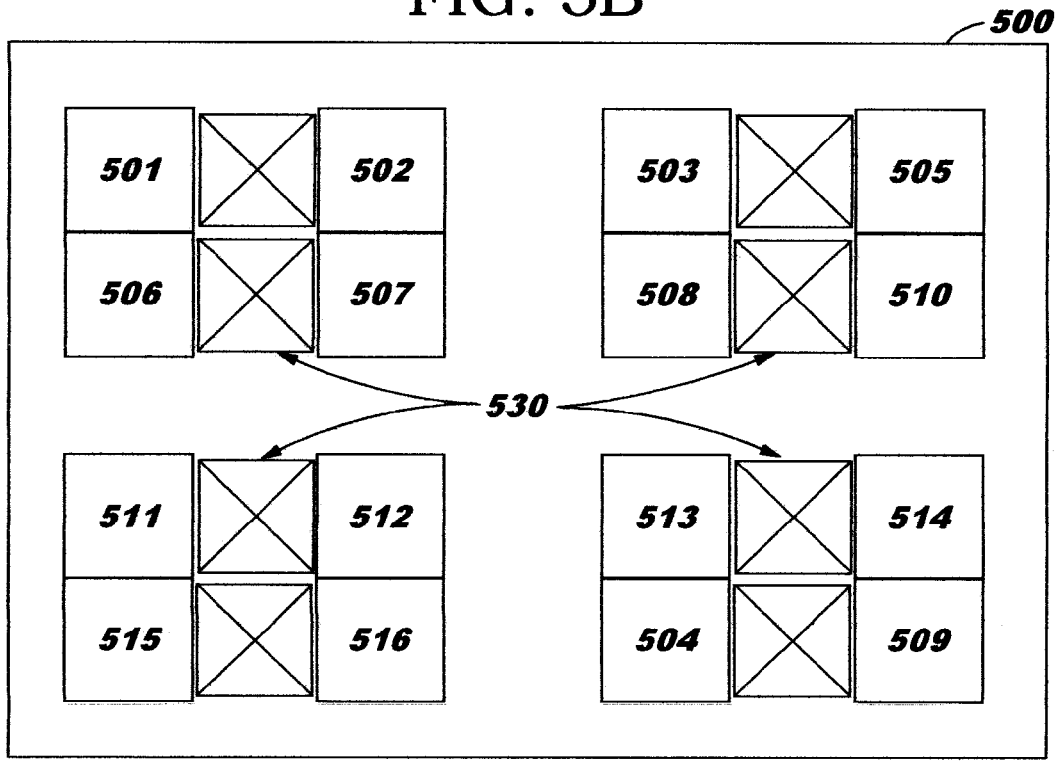

FIG. 5b shows a second distribution of mobile supports in accordance with the present invention. In particular, FIG. 5b shows the distribution that may result from the transit instructions calculated with respect to the distribution described with regard to FIG. 5a. As shown, in view of the equal activities of the different servers becoming equal, and of the respective resource requirements, for example in terms of power supply, network connections, coolant, etc., the servers 501 to 516 have been distributed evenly, with four servers attributed to each block of six socket units, in each case with two pairs of adjacent servers being separated by two empty socket units. It will be appreciated that there may be defined a set of rules for enabling the system to settle to a desired distribution in any situation, which may take into account many factors besides the information reaching the system through the various environmental sensors as described above. For example, rules might be provided such that, all other things being equal, the system may attempt to create practicable alleyways between groups of servers to facilitate inspection and the flow of air. As a further example, rules might be provided such that, all other things being equal, the system may attempt to space servers apart from each other as far as possible, so as to favour the dissipation of heat from the servers and the availability of free air. As a still further example, rules might be provided such that, all other things being equal, the system may attempt to arrange servers in a particular configuration such as the common cold-side/warm-side arrangement whereby a corridor is formed on each side of a row of servers, with cool air being drawn into the servers from one corridor and expelled as warm air into the other corridor.

Figure 5C:
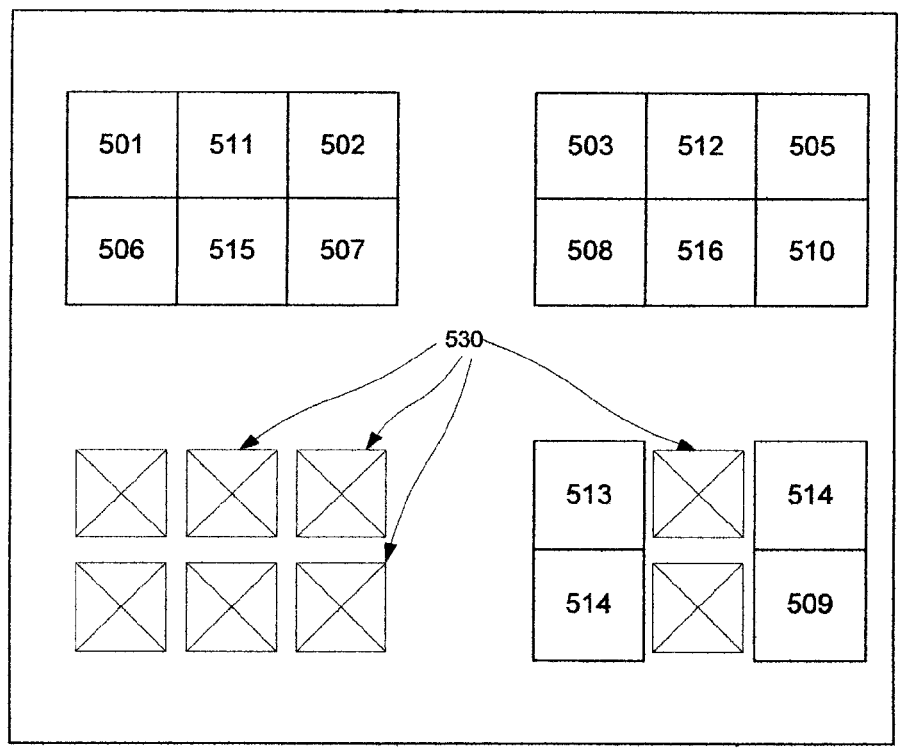

The system will furthermore be able to react to emergency situations as they arise. For example, FIG. 5c shows how the mobile supports may be reconfigured in the case where the power infrastructure supplying one of the blocks of six socket units fails. Accordingly, FIG. 5c shows a third distribution of mobile supports in accordance with the present invention. As shown, no power is available at the bottom left block of six socket units. Accordingly, the system has redistributed all of the servers to the other blocks, retaining where possible the two pairs configuration shown in FIG. 5b. The same result may arise in a number of ways. For example, each mobile support in the faulty block may independently determine that its power requirements are no longer being met, identify the nearest functional socket unit, and displace itself in accordance with the present invention. Alternatively, each mobile support may report the detected situation to the data centre control processor, which will determine an appropriate overall solution and issue instructions to all of the mobile units to be moved. Still further, the data centre control processor may itself determine that the error has occurred and issue instructions to the mobile supports, and so on.

In a case where the mobile units act independently, it is likely that more than one will attempt to move to the same socket unit. Where this occurs, the issue may be solved by a centralised mediation, or by an electronic negotiation between mobile units, for example over the wired network before displacement commences or via the wireless network after displacement commences. Still further, the Environment sensors of each mobile unit preferably comprise radar, sonar, optical, proximity, or touch sensors or switches by means of which nearby objects such as other mobile supports, furniture, walls, doors, windows, elevators, or socket units may be detected and preferably identified. More importantly still, the mobile units should most preferably be equipped to detect the presence of a human user. In a case where a human user is thus detected, all movement may be prevented, or movements may be coordinated to avoid the individual. The mobile units may also incorporate global positioning satellite (GPS) or other positioning technology so as to determine their position for navigation, and also for reporting to the data centre or other mobile supports. The mobile units may also incorporate radio frequency identification (RFID) tags, barcodes, machine readable alphanumeric codes, etc., to facilitate their identification by the system as a whole, by the data centre control module, or by other mobile supports. In a case where RFID tags or other electronically updatable means are provided, the RFID tag may be updated with data from the environment sensors 163, or more generally play the role of the wireless network interface 466 as described herein. The mobile units may also incorporate RFID readers, barcode readers, video cameras, etc., to respectively decode RFID tags, barcodes, machine readable alphanumeric codes located on socket units, other mobile supports, or walls, doors, windows, elevators, etc., of the data centre environment, or more generally throughout the environment in which the mobile supports are permitted to move.

Figure 5D:
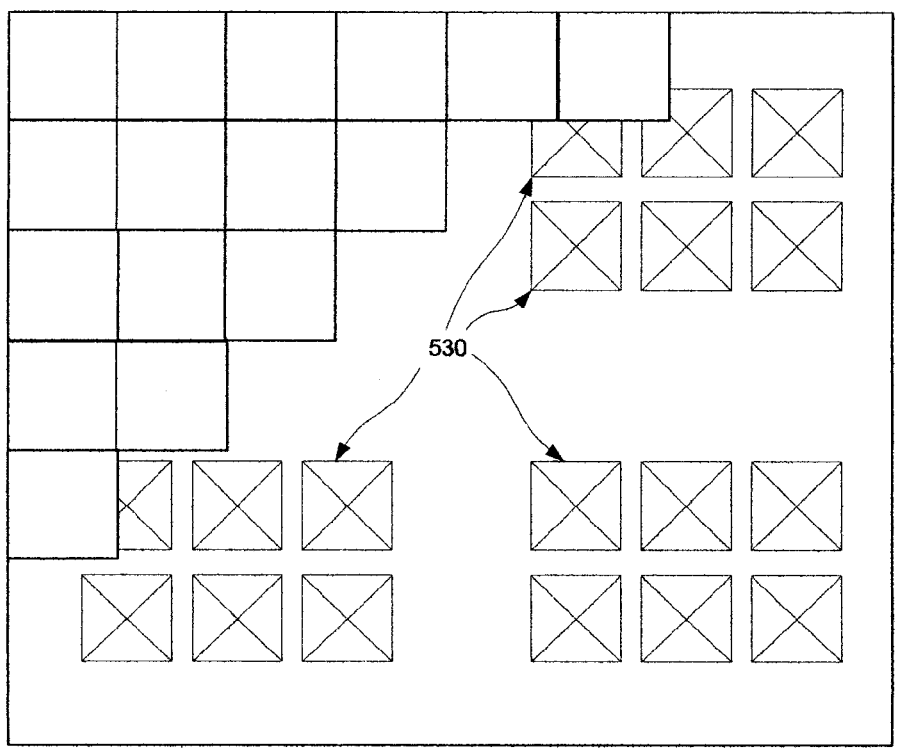

As a further example of example of how the system will furthermore be able to react to emergency situations as they arise, FIG. 5d shows how the mobile supports may be reconfigured in the case where a fire occurs in the data centre. Accordingly, FIG. 5d shows a fourth distribution of mobile supports in accordance with the present invention. As shown, a fire is assumed to have occurred in the bottom right hand corner of the data centre. Accordingly, the mobile supports have arranged themselves as far as possible from the location of the fire. Naturally, where the data centre is provided with an exit through which the mobile supports can pass, the system would prefer to evacuate the mobile supports altogether. Indeed, the mobile supports can be instructed to proceed to a predetermined rally point in exactly the same way as human employees. In addition to the temperature sensors that the mobile supports are preferably fitted with, and those with which the data centre itself may be provided, the system may also benefit from the provision of smoke sensors or other fire sensors. In a case where the data centre is equipped with sprinklers, the mobile units may be positioned in an emergency situation so that equipment that is determined to be on fire receives a maximum amount of water, and equipment that is determined not to be on fire receives as little as possible or no water.

According to a further embodiment, each mobile support may be provided with a microphone, whereby said predetermined signal may be an audio signal, and more particularly a voice command. On this basis, a mobile support may be able to react appropriately to commands such as "support number 5, forward two meters" and the like.

According to certain embodiments, the powered displacement means 264 in the form of wheels, etc., should be retractable so that in a static configuration, the mobile support's footprint is substantially the same as a conventional data centre hardware support.

The environment sensors 111 of the data centre control module 210 may comprise pressure sensors distributed through the floor of the data centre as a means to determining the location of the mobile units. This information may be fed back to the mobile units as required.

For the sake of simplicity, embodiments of the invention have been described in terms of a data centre control module 210, a socket unit 230, and a mobile support 260. It will be appreciated that the roles undertaken by these different elements may be distributed amongst them in many different ways without departing from the scope of the present invention. It has already been indicated, for example, that the tasks of the processor 112 may, in fact, be carried out by the processor 162 of one or more mobile supports. Similarly, various sensors can be distributed amongst the different elements in a variety of ways without changing their underlying role.

The socket unit as described in certain embodiments, for example with respect to FIG. 3 or 5, is capable of docking with a single mobile support. It will be appreciated that socket units capable of docking with a plurality of mobile supports are also envisaged. Indeed, FIG. 5 could equally have been described in terms of four socket units, each capable of docking with up to six mobile supports.

According to a further embodiment, a mobile support such as a rack or a platform for a rack housing a server or other electronic equipment is capable of independent movement and automatic connection and disconnection from resources such as network connection, coolant supply, and power supply. The coordination of a plurality of such mobile supports is envisaged so as to automatically distribute equipment in a data centre in such a way as to optimally use space and resources.

According to a further embodiment, each mobile support may be further provided with a diagnostic module. The system will furthermore be able to react to predetermined signals produced in response to output values generated by a mobile support's diagnostic routines. If the values generated by the diagnostic routines are signaling a system failure error, maintenance request, etc., the mobile support may disengage from the socket and displace itself to a predetermined location as described above, such as a maintenance location, in order to be repaired. Further in response to this predetermined signal, a second mobile support bearing equivalent hardware at another location (i.e., warehouse or storage location) could be prompted to displace itself to the location previously occupied by the unit reporting a system failure. This may involve waking the replacement unit from a standby or hibernation state, for example by means of a "wake on LAN" communication or the like. The replacing unit's subsystems are reconfigured to match the settings of the unit reporting a system failure during its route towards the socket or once connected thereto. The configuration information could be pushed through by the data centre control or by a peer-to-peer communication between the replacement unit and the unit reporting a system failure. This described behavior of calling in a replacement or backup unit may also be useful in the case of a determination of a requirement for extended data centre capacity.

The expression "predetermined signal" as used herein may relate to any signal intended to provoke a particular behavior from the mobile support, whether generated within the mobile support, by equipment carried by the mobile support, a socket or control center, a human user, or any other device capable of communicating, directly or indirectly, with the mobile support.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can, for example, contain or store the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

The invention claimed is:

1. A system comprising a mobile support device for electronic equipment, said mobile support device comprising:
   a power supply system comprising an unbreakable power supply (UPS) unit;
   a releasable coupler releasably coupling said power supply system to a first external power source at a first location and a second external power source at a second location;
   at least one processor and
   a powered displacer,
wherein, in response to a predetermined signal, said mobile support is adapted to:
   disengage from said first external power source;
   displace itself to said second location by said powered displacer operating under power supplied by said UPS unit; and
   releasably couple said power supply system to said second external power source.

2. The system of claim 1, further comprising:
   one or more subsystems, each exploiting a respective resource; and
   respective releasable couplers releasably coupling each of said subsystems to a respective first resource connection at a first location or a respective second resource connection at a second location; and
wherein said system is further adapted, in response to said predetermined signal, to:
   disengage each of said subsystems from said respective first resource connections; and
   releasably couple each of said subsystems to respective said second resource connections.

3. The system of claim 2, wherein one of said subsystems is a wired network interface and each of said first and second resource connections for said wired network interface is a wired network connection.

4. The system of claim 2, wherein one of said subsystems is a cooling system for cooling said electronic equipment and each of said first and second resource connections for said cooling system is a coolant source.

5. The system of claim 2, wherein said system is adapted to generate said predetermined signal as a result of a determination that a total demand placed on at least one of the first resource connections exceeds a predetermined threshold.

6. The system of claim 1, further comprising a wireless network interface, whereby at least a portion of said predetermined signal is received.

7. The system of claim 1, further comprising one or more environment sensors, and wherein said mobile support device is adapted to displace itself with reference to output of said sensors.

8. The system of claim 7, wherein said environment sensors include at least one of: a proximity sensor, a radar sensor, a sonar sensor, a global positioning satellite receiver, a microphone, a camera, and a pressure sensor.

9. The system of claim 1, further comprising one or more environment sensors, and wherein said system is adapted to generate said predetermined signal as a result of output of said sensors.

10. The system of claim 9, wherein said environment sensors include at least one of: a thermal sensor, a smoke sensor, and a voltage sensor.

11. The system of claim 1, wherein said system is adapted to generate said predetermined signal as a result of a determination that a total demand placed on said first external power source exceeds a predetermined threshold, and wherein said second location is selected as having a lower power consumption at said second external power source.

12. A method of managing a mobile support device for electronic equipment, the mobile support device including at least one processor, the method comprising:
   receiving, at said mobile support device, a predetermined signal;
   operating a releasable coupler to disengage a power supply system of said mobile support device from a first external power source at a first location, responsive to receiving said predetermined signal;
   causing displacement of said mobile support device from said first location to a second location by instructing a powered displacer integrated in said mobile support device and operating under power supplied by an unbreakable power supply (UPS) unit integrated in said mobile support device; and
   operating the releasable coupler to releasably couple said power supply system to a second external power source at said second location.

13. A non-transitory computer readable storage medium having encoded thereon a computer program, the computer program comprising computer program instructions for:
   receiving, for a mobile support that supports electronic equipment, a predetermined signal;
   operating a releasable coupler to disengage a power supply system of said mobile support from a first external power source at a first location, responsive to receiving said predetermined signal;
   causing displacement of said mobile support from said first location to a second location by instructing a powered displacer integrated in said mobile support and operating under power supplied by an unbreakable power supply unit integrated in said mobile support; and
   operating the releasable coupler to releasably couple said power supply system to a second external power source at said second location.

* * * * *